US007763939B2

(12) United States Patent
Leibiger

(10) Patent No.: US 7,763,939 B2
(45) Date of Patent: Jul. 27, 2010

(54) LOW ON RESISTANCE CMOS TRANSISTOR FOR INTEGRATED CIRCUIT APPLICATIONS

(75) Inventor: Steven Leibiger, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/126,108

(22) Filed: May 23, 2008

(65) Prior Publication Data

US 2008/0290419 A1    Nov. 27, 2008

Related U.S. Application Data

(60) Provisional application No. 60/939,639, filed on May 23, 2007.

(51) Int. Cl.
  H01L 29/94    (2006.01)
  H01L 29/76    (2006.01)
(52) U.S. Cl. .................. 257/341; 257/401; 257/E29.12
(58) Field of Classification Search ................. 257/341, 257/401, E29.12
  See application file for complete search history.

(56) References Cited

U.S. PATENT DOCUMENTS

| 5,488,236 A | 1/1996 | Baliga |
| 5,742,087 A | 4/1998 | Lidow |
| 6,060,406 A | 5/2000 | Alers et al. |
| 7,091,565 B2 * | 8/2006 | Sutardja ...................... 257/401 |
| 7,164,176 B2 * | 1/2007 | Sutardja ...................... 257/401 |
| 2002/0113276 A1 * | 8/2002 | Magri' et al. ................. 257/401 |
| 2005/0116268 A1 * | 6/2005 | Tahira et al. ................. 257/288 |
| 2005/0127438 A1 * | 6/2005 | Hossain et al. .............. 257/341 |
| 2007/0138549 A1 * | 6/2007 | Wu et al. ..................... 257/341 |
| 2008/0093730 A1 * | 4/2008 | Furuta ......................... 257/712 |

FOREIGN PATENT DOCUMENTS

JP    2004 349331 A    12/2004

OTHER PUBLICATIONS

Fujishima, et al., "A high-density low on-resistance trench lateral power mosfet with a trench bottom source contact", IEEE Transactions on Electron Devices, vol. 49, Issue 8, Aug. 2002, pp. 1462-1468, see whole document.
International Search Report of Corresponding PCT application (Int'l. Application No. PCT/US08/64644, filed May 23, 2008), completed and mailed Dec. 9, 2008, total 7 pages.

* cited by examiner

*Primary Examiner*—Ngan Ngo
(74) *Attorney, Agent, or Firm*—Thomas R. FitzGerald; Hiscock & Barclay, LLP

(57) ABSTRACT

An array of power transistors on a semiconductor chip has serpentine gates separated by alternating source and drain regions. The gates combine rounded ends and rectangular sections joining the rounded ends. This geometry allows the metallization, in which the upper and lower metal layers are substantially congruent with each other, to have a design width that can be increased or decreased with the changes in width matched by the length of the rectangular sections thus allowing flexibility in the design of the power transistors.

30 Claims, 17 Drawing Sheets

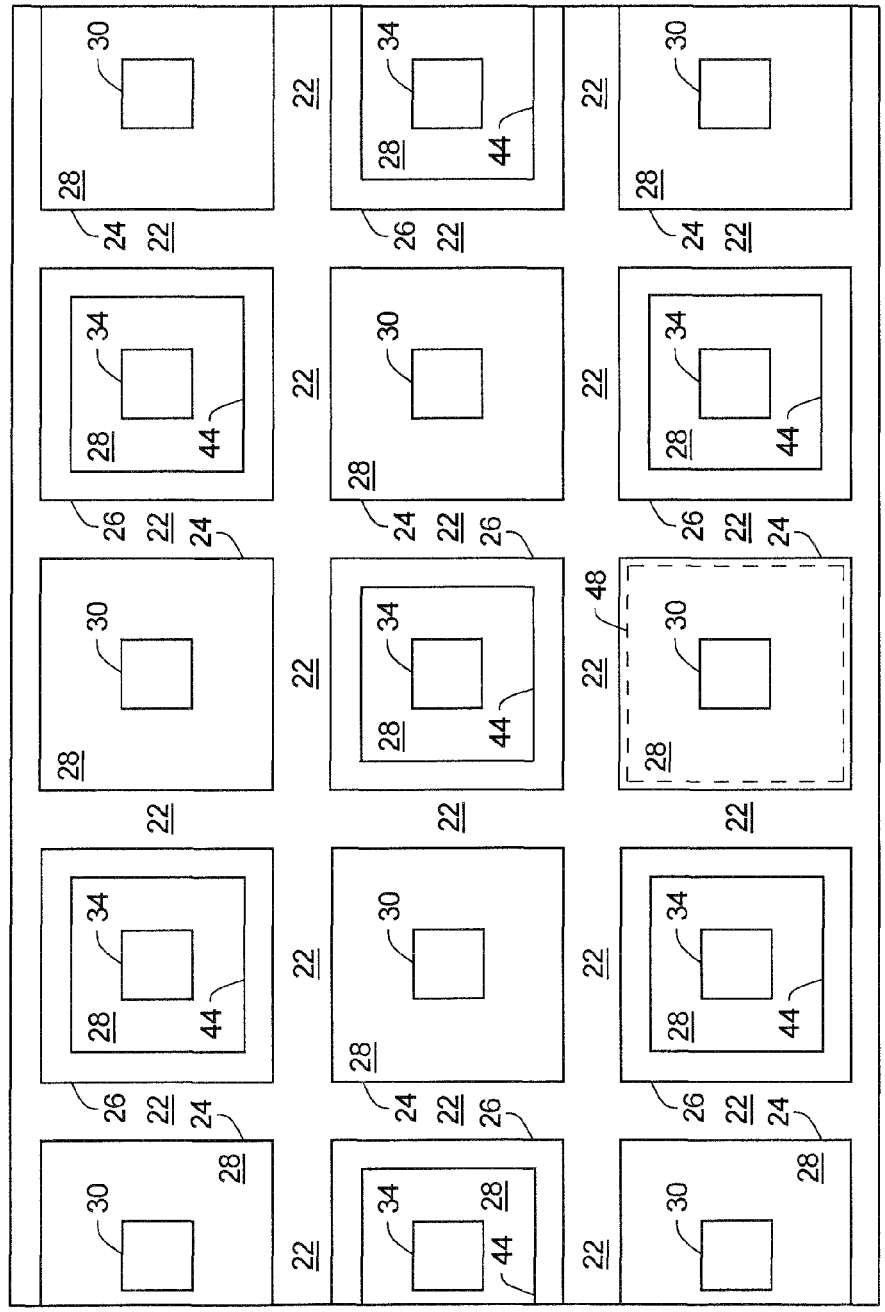

LOW ON RESISTANCE CMOS TRANSISTOR FOR INTEGRATED CIRCUIT APPLICATIONS

CROSS REFERENCE TO RELATED APPLICATIONS

This application claims the benefit of U.S. Provisional Application No. 60/939,639, filed May 23, 2007, which is incorporated herein by reference in its entirety.

FIELD OF THE INVENTION

This invention relates to low on resistance MOSFET transistors, and more particularly to low on resistance MOSFET transistors with extended gates with multiple contacts to the source and drain regions.

BACKGROUND OF THE INVENTION

MOSFETs with extremely large gate widths, such as power MOSFETs, naturally require more chip area than conventional MOSFETs, and therefore making compact power MOSFETs with large width gates is advantageous, especially when such MOSFETs are part of an integrated circuit, where layout area is a precious commodity. FIG. 1 is a top diagrammatic view of a current type of extended gate MOSFET 20 with large gate width, known as a waffle transistor. The gates 22 are laid out in a crosshatch lattice pattern with sources 24 and drains 26 formed inside the islands formed by the lattice of the gates. The individual sources 24 and drains 26 have silicide overlying regions 28 and are connected together by source contacts 30 to source metal 1 strips 32 and by drain contacts 34 to drain metal 1 strips 36. These metal 1 strips are connected together by metal 2 (not shown) which are also strips and run in a direction to intersect each of the metal 1 strips.

There are several characteristics of the waffle transistor 20 shown in FIG. 1 that limit the operating characteristics of the transistor. The poly sections 38 where the gates cross are about 10% of the total gate poly and do not contribute greatly to the device drive current because they lack access to the source and drain regions. Therefore, the layout area consumed by locations 38 is mostly wasted space. Furthermore, because of the stripped nature of the metallization about ½ of the deposited metal is removed because the minimum metal 1 line and space dimensions are about equal. Also since the metal strips are angled at an optimal 45° with respect to the direction of current flow (the metal 1 and metal 2 intersect each other), the length of the metal is increased by a factor of 1.4 which increases the effective $R_{on}$ of the transistor. Moreover, the vias between metal 1 and metal 2 can only be made at the intersection of the metal 1 and metal 2, and hence the amount of current which can pass between the two metal layers may be limited by the current capacity of the vias.

Power transistors usually require well taps to improve latchup and safe operating area (SOA) characteristics, which are connections between the sources and the wells with highly doped regions of the same polarity of impurities as the wells which extend from the wells to the source silicides, to provide increased immunity to latch-up of the transistor. However, in the waffle transistor 20 the gates 22 break the sources into small isolated regions, and there is not room to create a butted or integrated well tap in each source 24 of the waffle transistor 20. As a result each source location can be used as a true source or as a well tap. Replacing selected source locations with well taps 40, as shown in FIG. 2, results in a waffle transistor 42 which has lower drive and higher resistance, effectively making the transistor smaller. Moreover, there is a necessary gap between each source and a well tap, which diminishes the effectiveness of the well taps.

It is sometimes advantageous in power transistor arrays to put ballast resistors between the gate and the emitter to protect against electrostatic discharge (ESD) and to balance the current load for each part of or section of the transistor. A common method to form a ballast resistor is to leave a gap between the gate edge and the drain silicide. FIG. 3 shows such ballast resistor gaps 44 in the drain regions of a waffle transistor 46. The reduced area of the drain silicide means that the drain rectangular area must be increased in order to provide the same current density through each drain as shown by the dashed rectangle 48 which corresponds to the perimeter of the one of the drains 26 shown in FIG. 1. As a result the size of each source also grows because the checkerboard grid pattern forces the drain and source squares to be the same size.

SUMMARY OF THE INVENTION

The invention comprises, in one form thereof, a power MOSFET including first and second source regions and a drain region adjacent to a top surface of a layer formed on a top surface of a substrate, and a first gate between the first source region and the drain region and a second gate between the drain region and the second source region, the first and second gates having a first plurality of sections each consisting of a curved section and a straight section wherein the straight sections in the first plurality of sections in each of the first and second gates are parallel to each other, and the first and second gates are substantially a mirror image of each other with respect to a plane between the first and second gates which is orthogonal to the top surface of the substrate.

In yet another form, the invention includes a method for forming a power MOSFET, the method comprising the steps of forming first and second source regions and a drain region adjacent to a top surface of a layer formed on a top surface of a substrate, and forming a first gate between the first source region and the drain region and a second gate between the drain region and the second source region, the first and second gates having a first plurality of sections each consisting of a curved section and a straight section, wherein the straight sections in the first plurality of sections in each of the first and second gates are parallel to each other, and the first and second gates are substantially a mirror image of each other with respect to a plane between the first and second gates which is orthogonal to the top surface of the substrate.

In still another form, the invention includes a method of designing a MOSFET with multiple sources, drains, and gates wherein each of the sources, are to be connected together, each of the drains are to be connected together, and each of the gates are to be connected together, and having two metal layers, by routing the first and second metal layers for each of the sources and drains over each other, setting the width of the first and second metal layers over the sources and drains to enable vias of sufficient number and size to efficiently conduct an expected maximum current between the metal layers while leaving areas along a center line of the first metal layer for a sufficient number of contacts to the first metal layer from the sources and the drains and to efficiently conduct the expected maximum current between the first metal layers and the sources and the drains, and forming each of the gates as a continuous set of alternating sinuous sections and parallel straight sections, aligning adjacent gates such that one gate is a mirror of the other gate along a line between the gates such that the regions between the closest sinuous sections of the two gates has sufficient room for the contacts, and the distance between opposite sinuous sections of each gate being no wider than is needed for an overlap of the source first and second metal layers and the drain first and second metal layers and a minimum lateral space between the source and drain metal layers.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein:

FIG. 3 is a top diagrammatic view of another modified version of the waffle transistor of FIG. 1;

Figure 1:
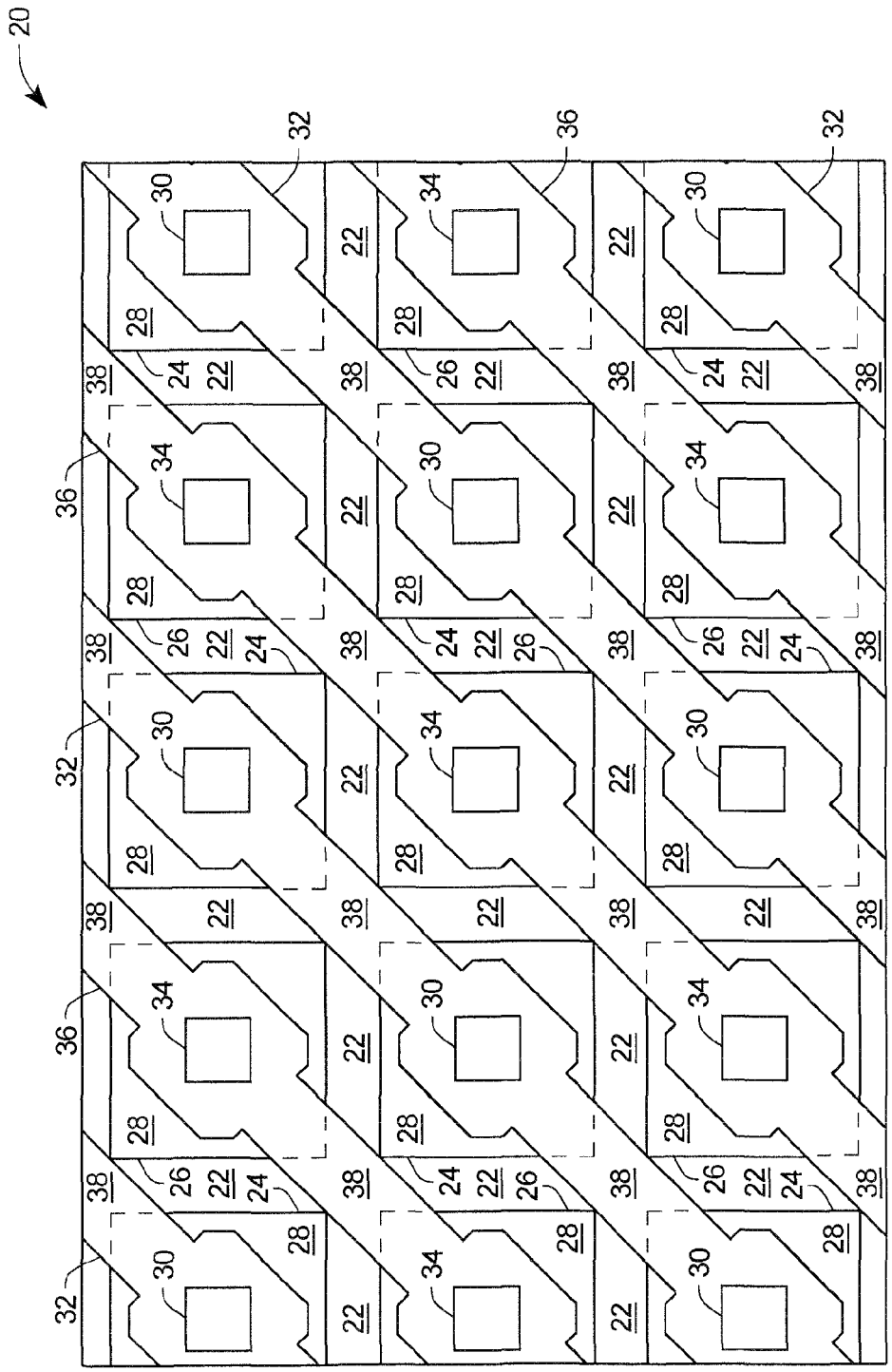
FIG. 1 is a top diagrammatic view of a prior art waffle transistor.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

Figure 4A:
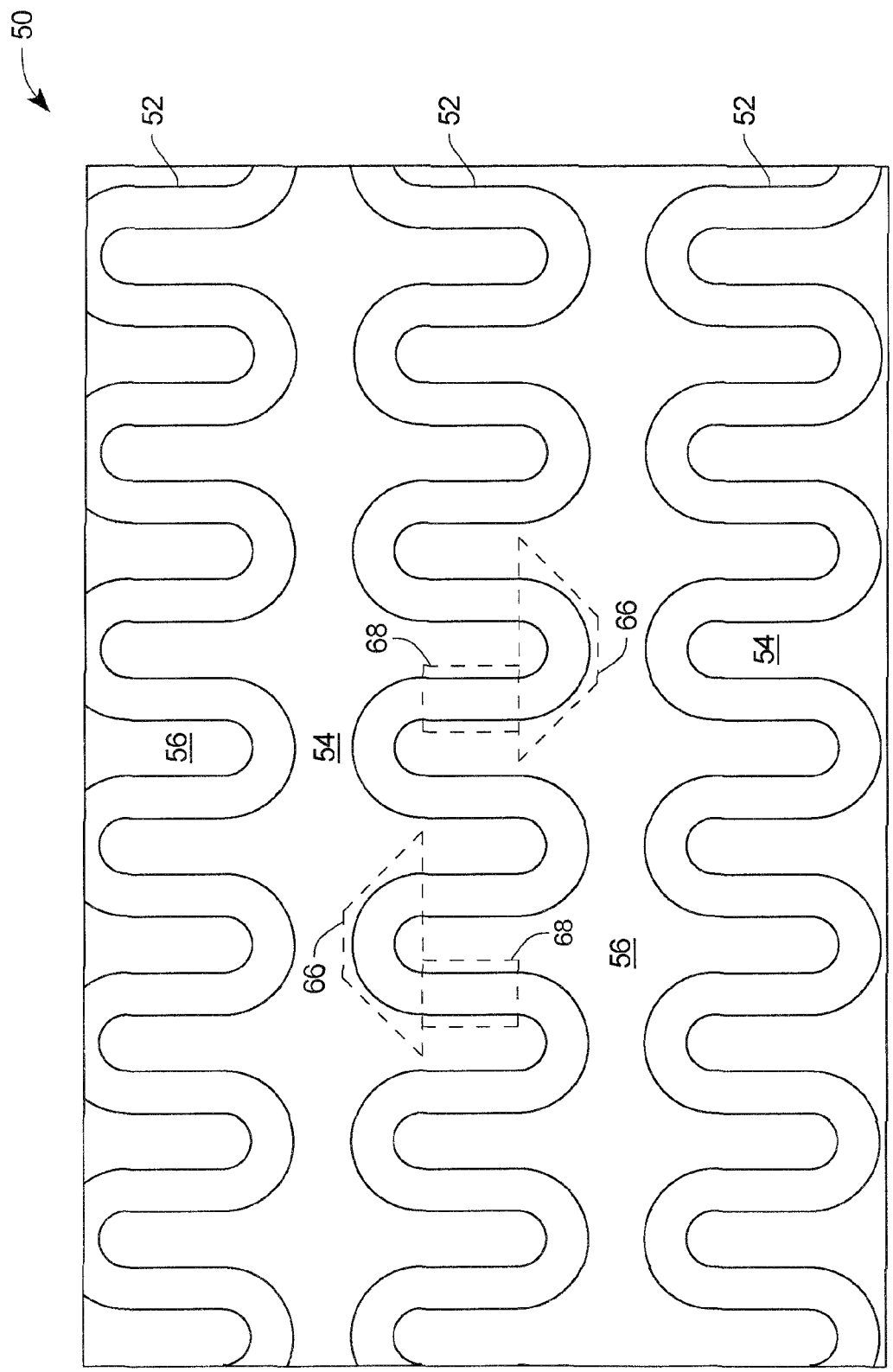
FIGS. 4A, 4B, and 4C are top diagrammatic views of various stages in the formation of a power transistor according to an embodiment of the present invention.

FIG. 4A is a top diagrammatic view of a portion 50 of a power MOSFET at a particular step in the fabrication process. The portion 50 has a plurality of gate electrodes 52 between source regions 54 and drain regions 56 according to one embodiment of the present invention. The gates 52 have a regular sinuous or serpentine geometry with half round sections 66 and parallel straight sections 68 connecting the half round sections. Adjacent gates 52 are mirror images of each other.

Figure 4B:
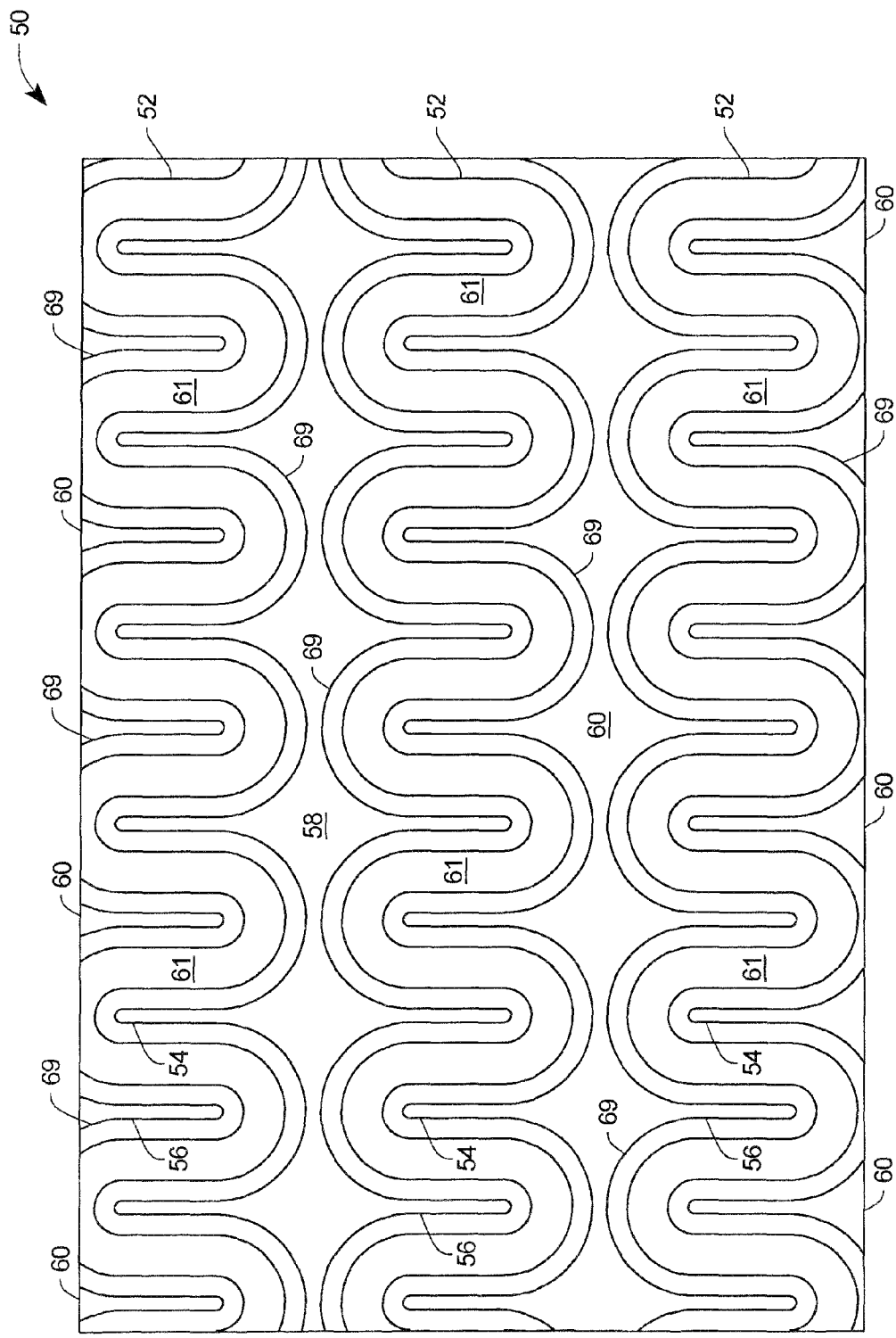
Figure 4C:
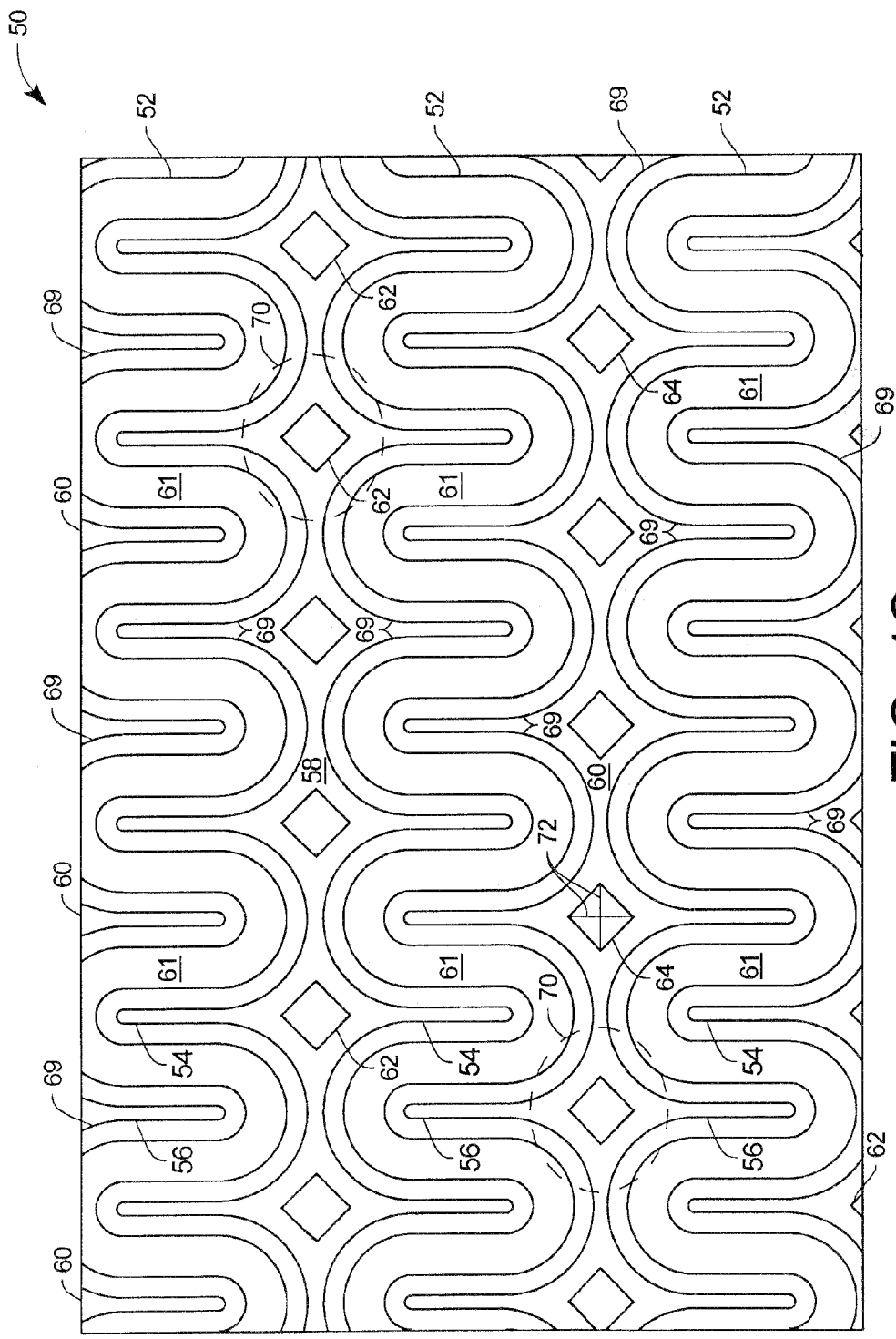

FIG. 4B is FIG. 4A after gate sidewall oxides 69 have been formed on the gates 54, and the exposed silicon has been silicided. Overlaying the source regions 54 and the drain regions 56 are silicide layers 58 and 60, respectively, and overlaying the gate electrodes 52 are silicide layers 61. FIG. 4C is FIG. 4B after source and drain contacts have been added. The source and drain regions 54, 56 have contacts 62 and 64, respectively, for connections to a metal 1 layer shown in some of the other figures.

As shown in FIG. 4C the respective source regions and drain regions 54, 56 between the gates 52 have relatively wide regions 70 between adjacent half round regions 66 of adjacent gates 52. The respective contacts 62, 64 may be located in these regions 70. The contacts 62, 64 may be in the form of a square with one of their two diagonals 72 parallel with the edges of the straight sections 68 of the gates 52. In this orientation the area of the contacts 62, 64 can be made larger than if the contacts had edges parallel with the edges of the straight sections 68. This canting of the contacts 62, 64 increases the amount of current that can flow through each contact which is important in a power device.

Along with the number and size of the contacts 62, 64 another design consideration is the current carrying capacity of the vias between the first and second metal layers. The current path through the metal layers can be of significant length, so the power lost in the metallization is usually an important consideration in the design of power devices. While the prior art design shown in FIG. 1 uses two metal layers to connect the individual metal strips for the source regions and drain regions, the use of multiple metal layers to reduce the combined metallization resistance can be of great advantage. As a consequence the number and size of the vias is important.

Figure 5A:
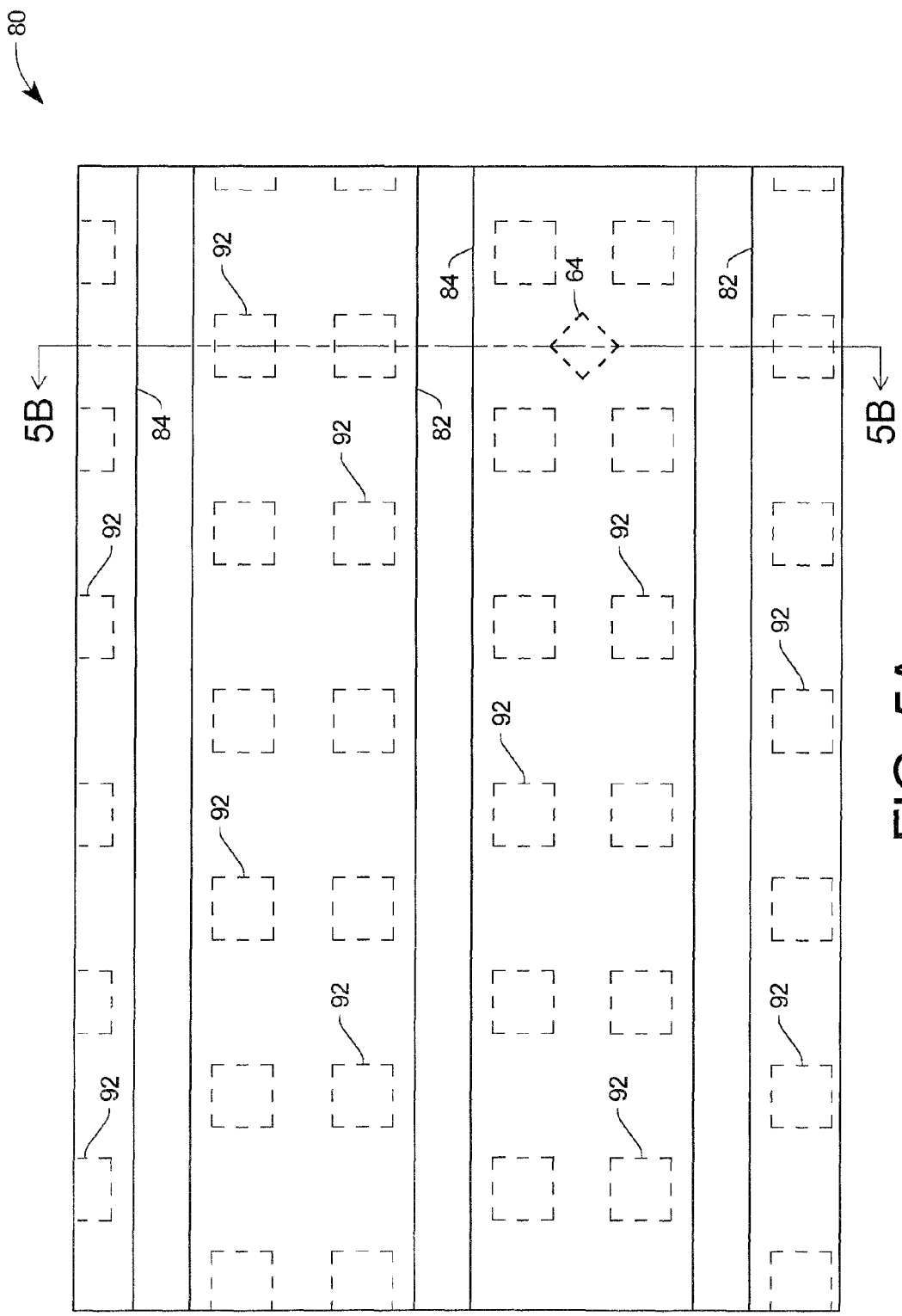
FIGS. 5A and 5B are respective top and side diagrammatic views of the metallization layers the power MOSFET shown in FIG. 4A.
Figure 5B:
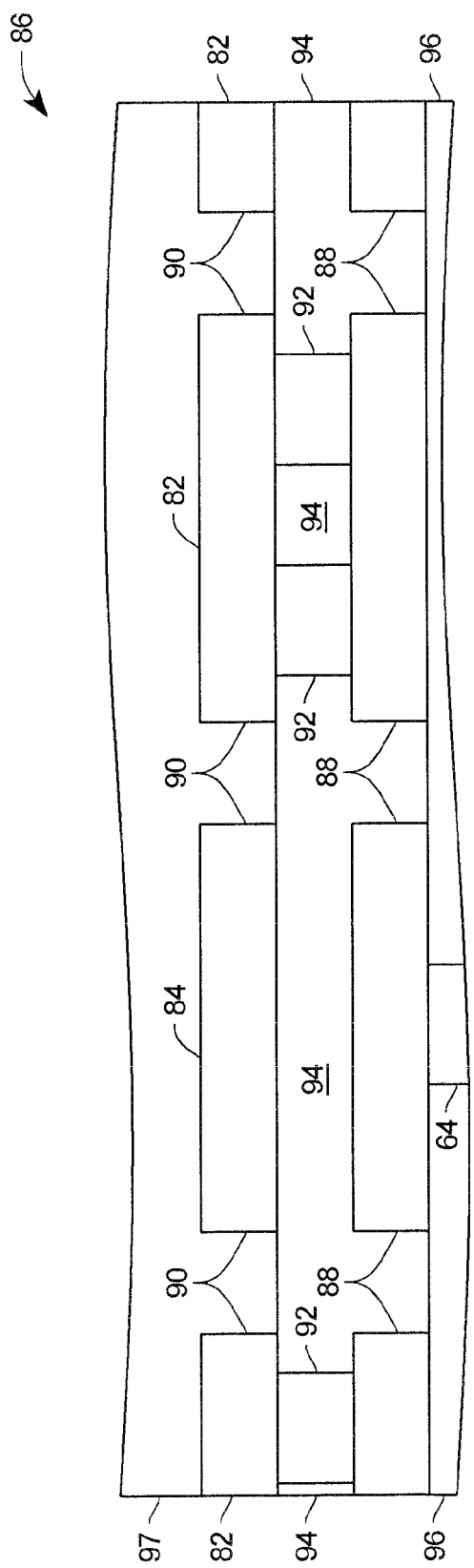

FIG. 5A is a top diagrammatic view 80 of source metal layers 82 and drain metal layers 84 which are the metallization layers for the portion 50 of the power MOSFET shown in FIG. 4A. FIG. 5B is a side diagrammatic view 86 taken along the line 5B-5B in FIG. 5A. Each of the metal layers 82, 84 are comprised of a first metal layer or metal 1 layer 88 under a second metal layer or metal 2 layer 90, the two layers have equal widths and coincident vertical edges over most of the power device in one embodiment of the invention. The first and second metal layers 88, 90 are separated by a first inter level oxide 94 with the vias 92 extending through the first inter level oxide 94 to connect the first metal layers 88 and the second metal layers 90. Below the metal 1 layer 88 is a second inter level oxide layer 96 and the contacts 62, 64 shown in FIG. 4C (one of the contacts 64 is shown in FIG. 5B) which extend through the second inter level oxide layer 96. A passivation layer 97 overlays the metal 2 layer 90.

Figure 6A:
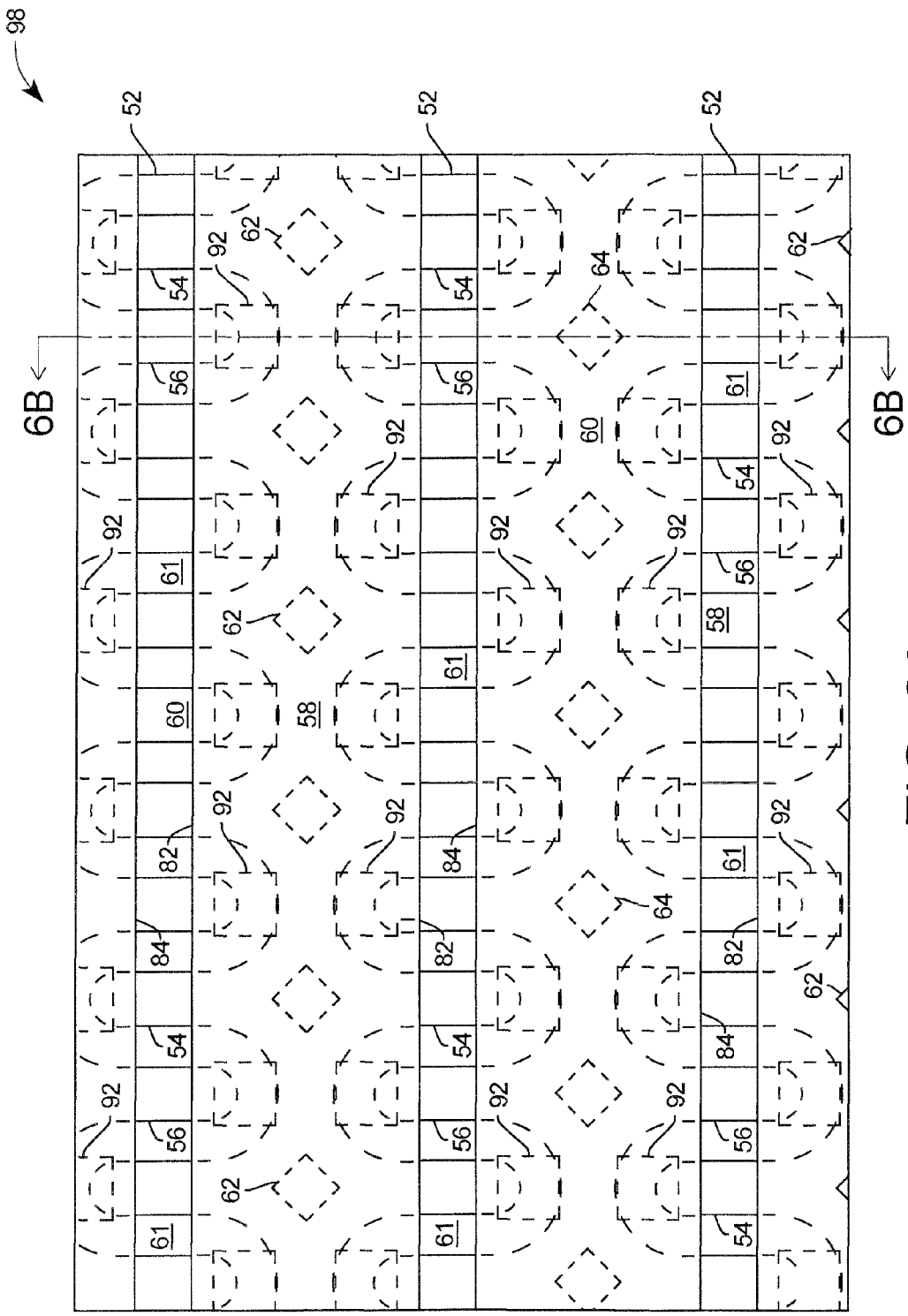
FIGS. 6A and 6B are respective top and side composite views of the metallization layers of FIG. 5A placed on the top diagrammatic view of FIG. 4C with the addition of gate silicides.
Figure 6B:
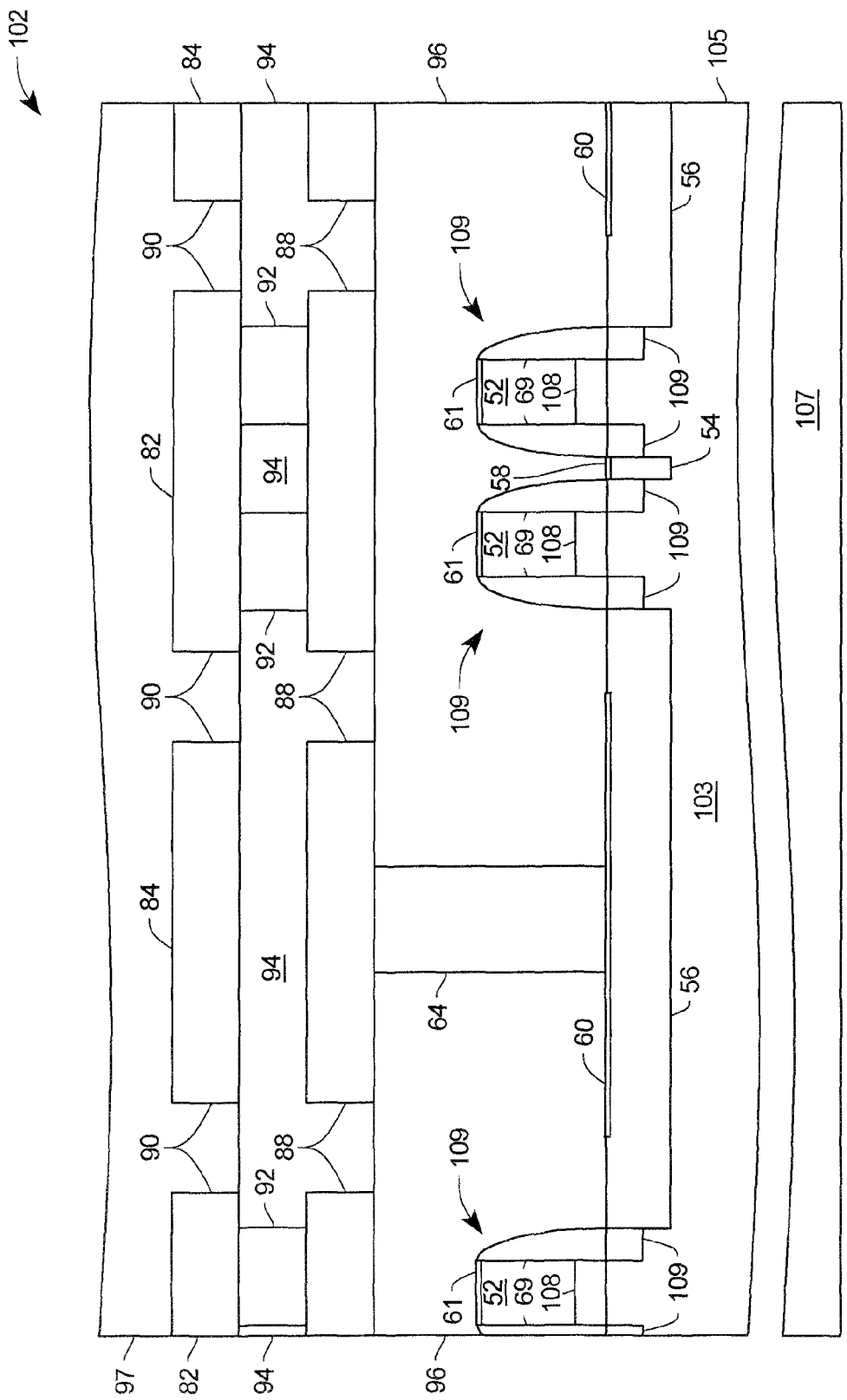

FIG. 6A is a top composite view 98 of the metallization layers of FIG. 5A placed on the portion 50 shown in FIG. 4C. FIG. 6B is a side diagrammatic view 102 taken along the line 6B-6B in FIG. 6A and includes a P well formed 103 in a lightly doped epitaxial layer 105 grown on a substrate 107, source and drain regions, 54, 56, respectively, source and drain silicides 58, 60, respectively, gates 109, gate silicides 61, a drain contact 64, and the structure shown in FIG. 5B. Each of the gates 109 has a gate electrode 52, sidewall oxides 69, a gate oxide 108 and an LDD region 109 below each of the sidewall oxides.

The large metallization areas shown in FIGS. 5A and 5B, as compared to the metallization of the waffle transistor shown in FIG. 1, are made possible by the source, drain, and gate layout shown in FIG. 4A. The metallization shown in FIGS. 5A and 5B allow a large part of the deposited metal to be retained during the metal etching process since the horizontal gap between the metal layers is limited by the minimum feature spacing of the manufacturing process. Also, the current through both of the overlapping metal layers is flowing in the same direction thereby reducing or eliminating the necessity to control the capacitance between the metal layers. Moreover, the effects of thickness variations in one metal layer can be mitigated by the other overlapping layer.

In order for the two layers of metallization to have approximately the same current density, the number and size of the vias 94 is important. Since the effects of the metallization are usually one of the most important elements of the efficiency of the power device, being able to optimize the metallization, including the vias, is desirable. With the present invention the designer may first calculate the metallization dimensions and the number and size of the vias, and then match the dimensions of the gates 52 to accommodate the metallization and vias.

Figure 7A:
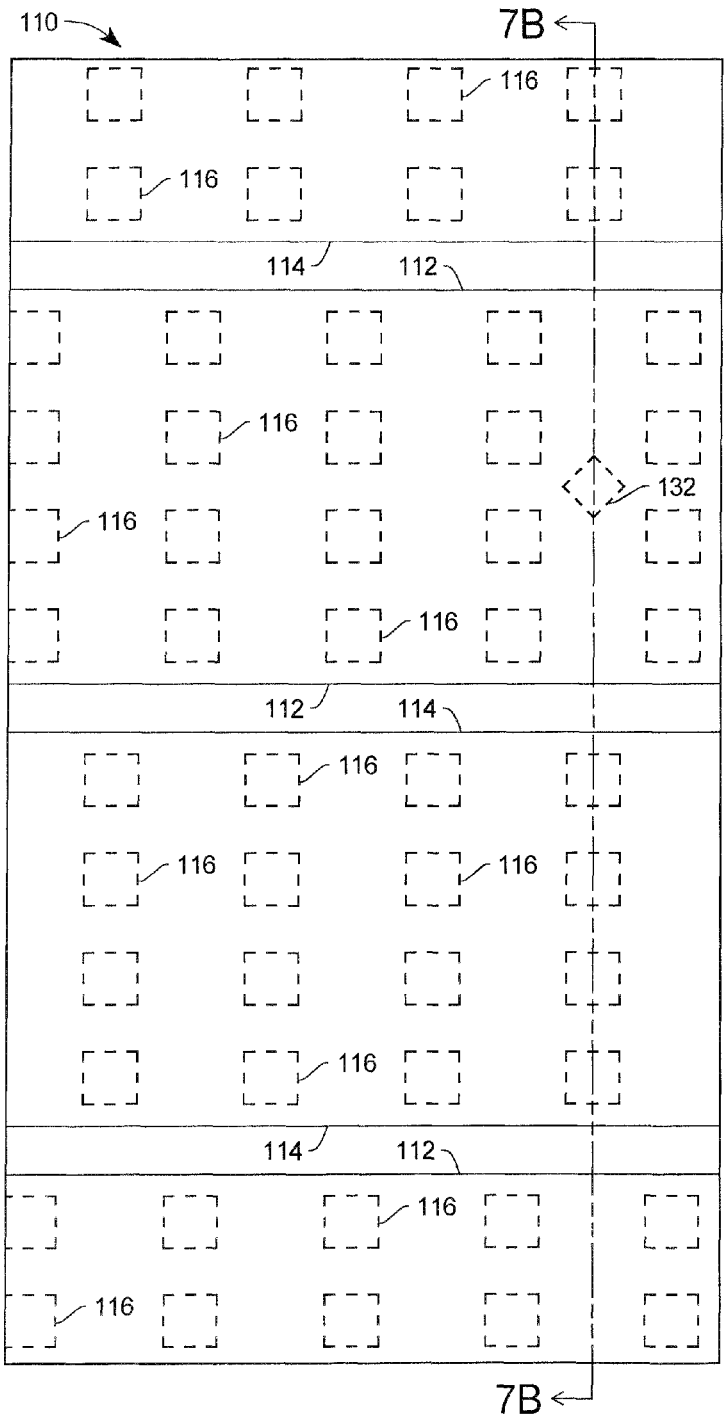
FIGS. 7A and 7B are respective top and side diagrammatic views of a power transistor according to another embodiment of the present invention.
Figure 7B:
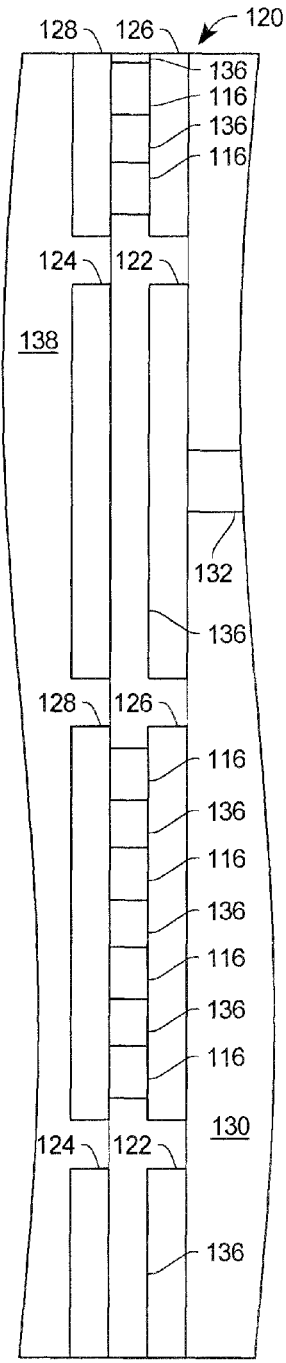

FIG. 7A is a top diagrammatic view 110 of a power transistor according to another embodiment of the present invention showing double level source metal layers 112, double level drain metal layers 114 and vias 116 between the two metal layers. In this design the width of the metallization is approximately twice the width of the metallization shown in FIG. 5. FIG. 7B is a diagrammatic side view 120 taken along line 7B-7B of FIG. 7A wherein the source metal layers 112 have a source lower or metal 1 layer 122 and a source upper or metal 2 layer 124. Similarly, in FIG. 7B the drain metal layers 114 have a drain lower or metal 1 layer 126 and a drain upper or metal 2 layer 128. A first inter level oxide layer 130 is below the two lower metal layers 122, 126 with a contact 132 from the source lower metal layer 122 to the source silicide 152 shown in FIG. 8. A second inter level oxide layer 136 separates the upper and lower metal layers with the vias 116 connecting the two layers together. A passivation layer 138 overlays the metal 2 layer 128.

Figure 8:
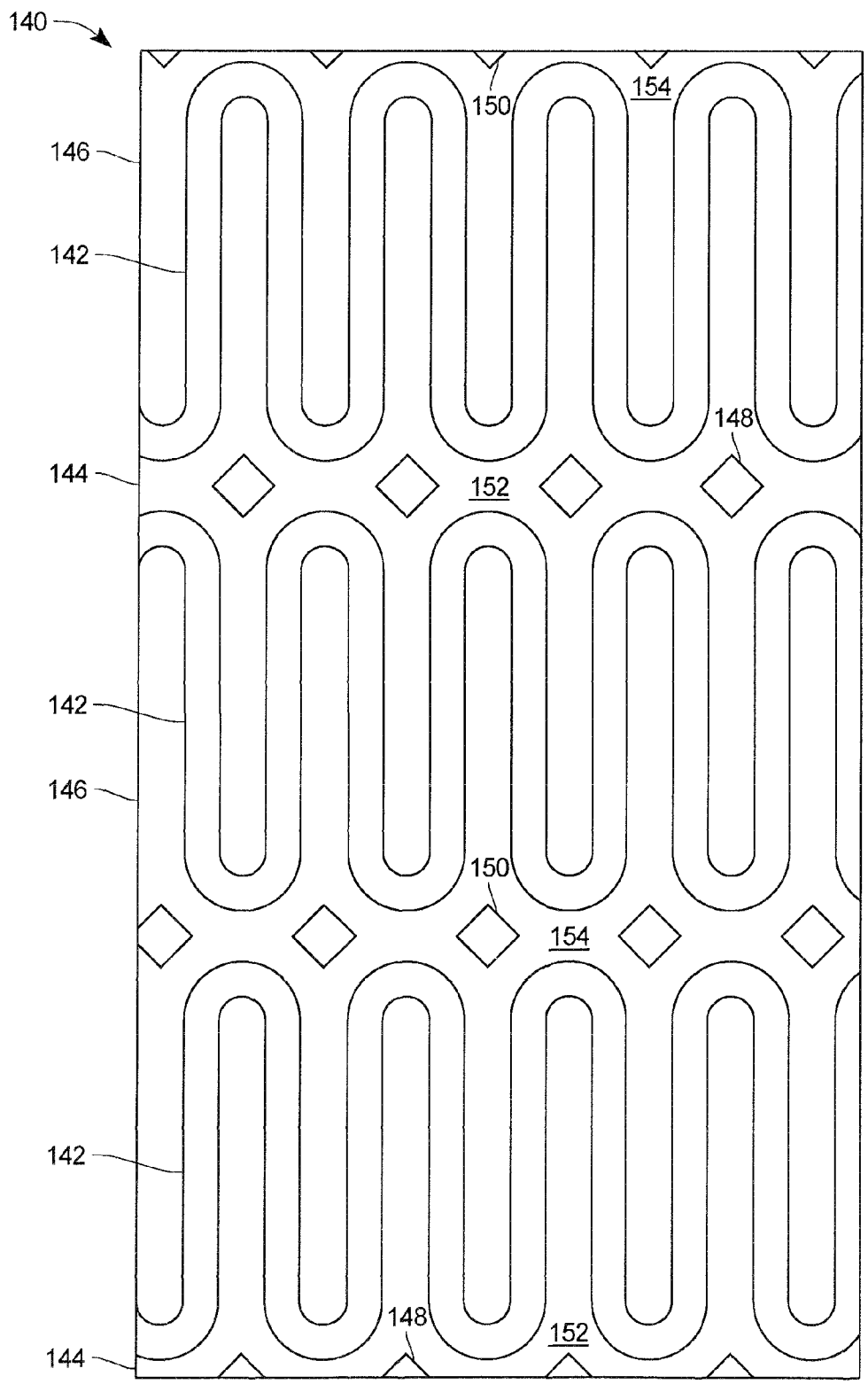
FIG. 8 is a top diagrammatic view of gates, source regions, drain regions, source contacts, and drain contacts which are laid out to match the metallization of FIGS. 7A and 7B.

FIG. 8 is a top diagrammatic view 140 of gate electrodes 142, source regions 144, drain regions 146, source silicides 152, drain silicides 154, source contacts 148, and drain contacts 150 which are laid out to match the metallization of FIGS. 7A and 7B. The gates 142 of FIG. 8 and the source regions 144 and drain regions 146 are the same as the gates 52, source regions 54, and drain regions 56 of FIG. 4A except that the gates 52 have been lengthened in one direction by stretching the rectangular sections 68 without changing the half round sections 66. The source regions 54 and drain regions 56 with their respective silicide layers 54 and 60 in FIG. 4A have been altered to stretch between their respective gates.

Figure 9:
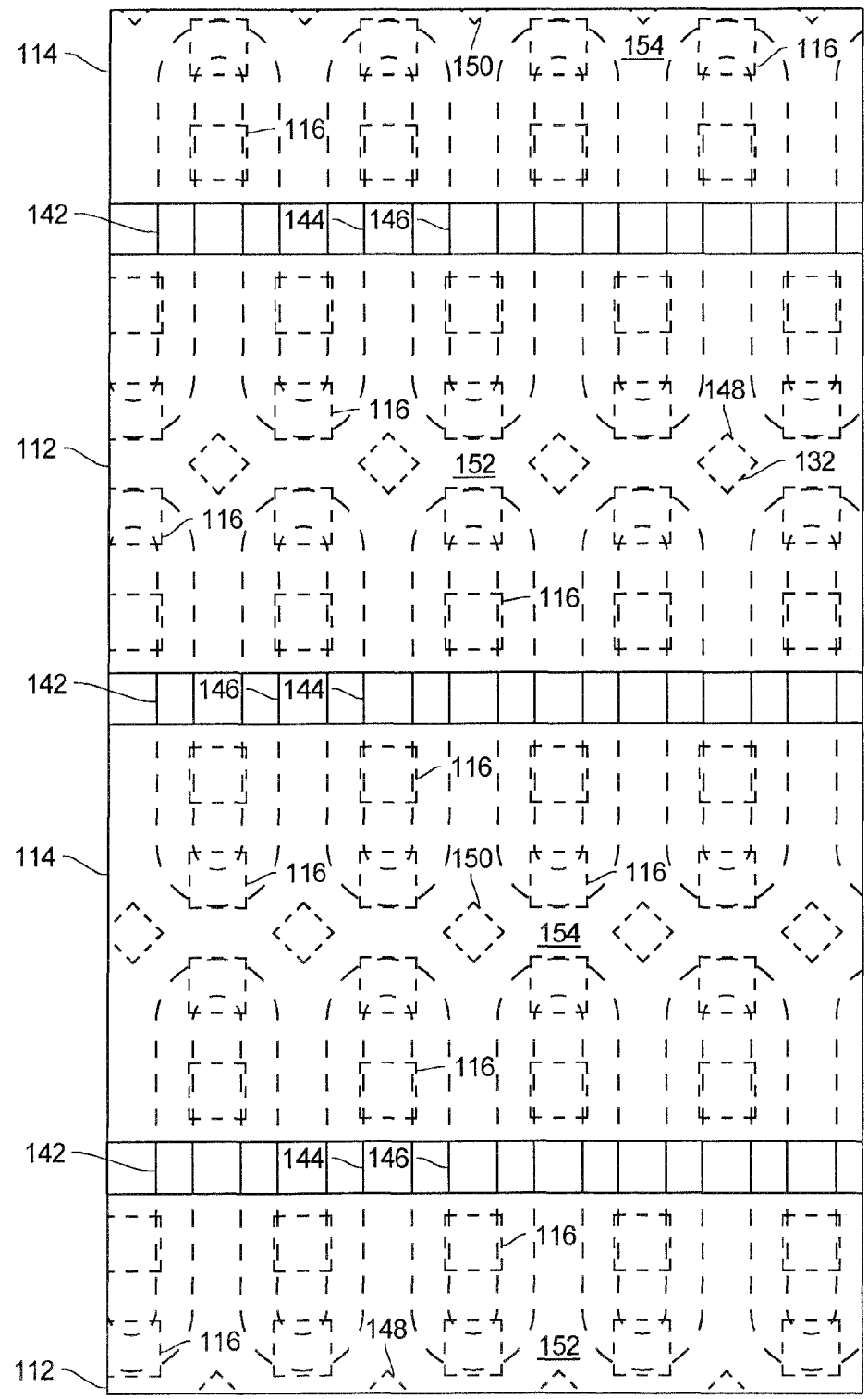
FIG. 9 is a composite of FIGS. 7A and 8 showing their relative alignment.

FIG. 9 is a composite of FIGS. 7A and 8 showing their relative alignment.

Figure 2:
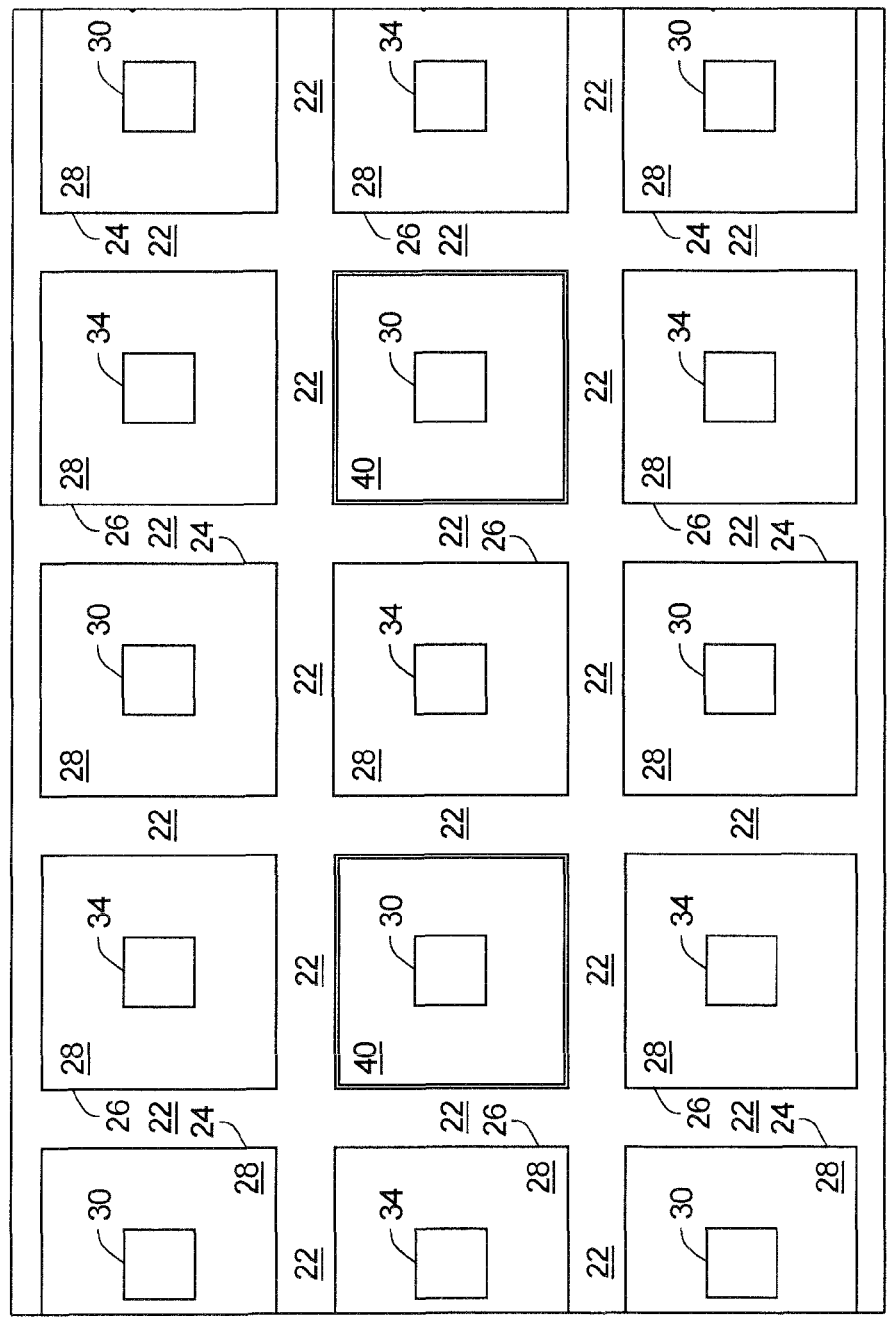
FIG. 2 is a top diagrammatic view of a modified version of the waffle transistor of FIG. 1.
Figure 10A:
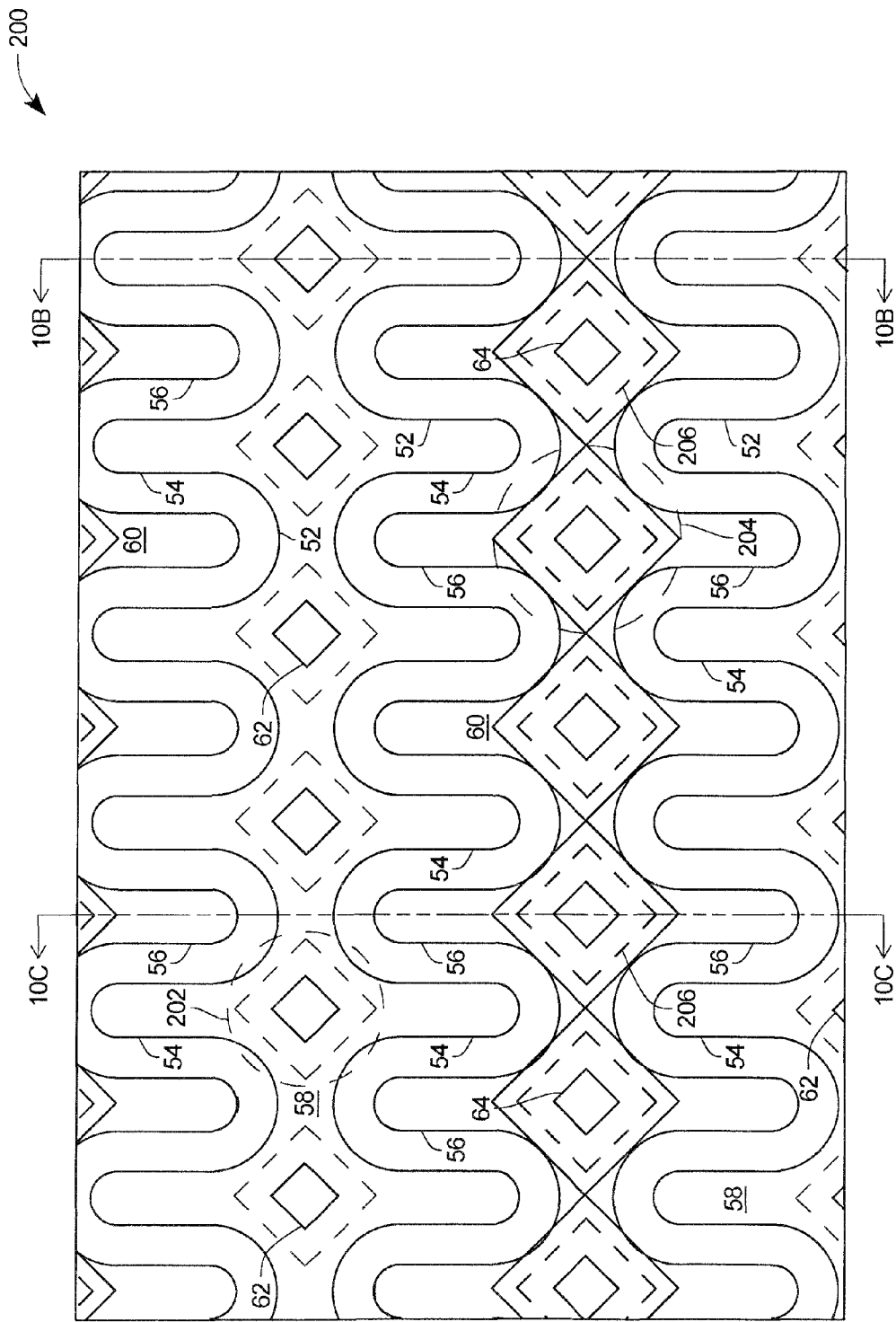
FIGS. 10A, 10B and 10C are a respective top and two side diagrammatic views of FIG. 4 with the addition of butted well taps and drain ballast resistors.
Figure 10B:
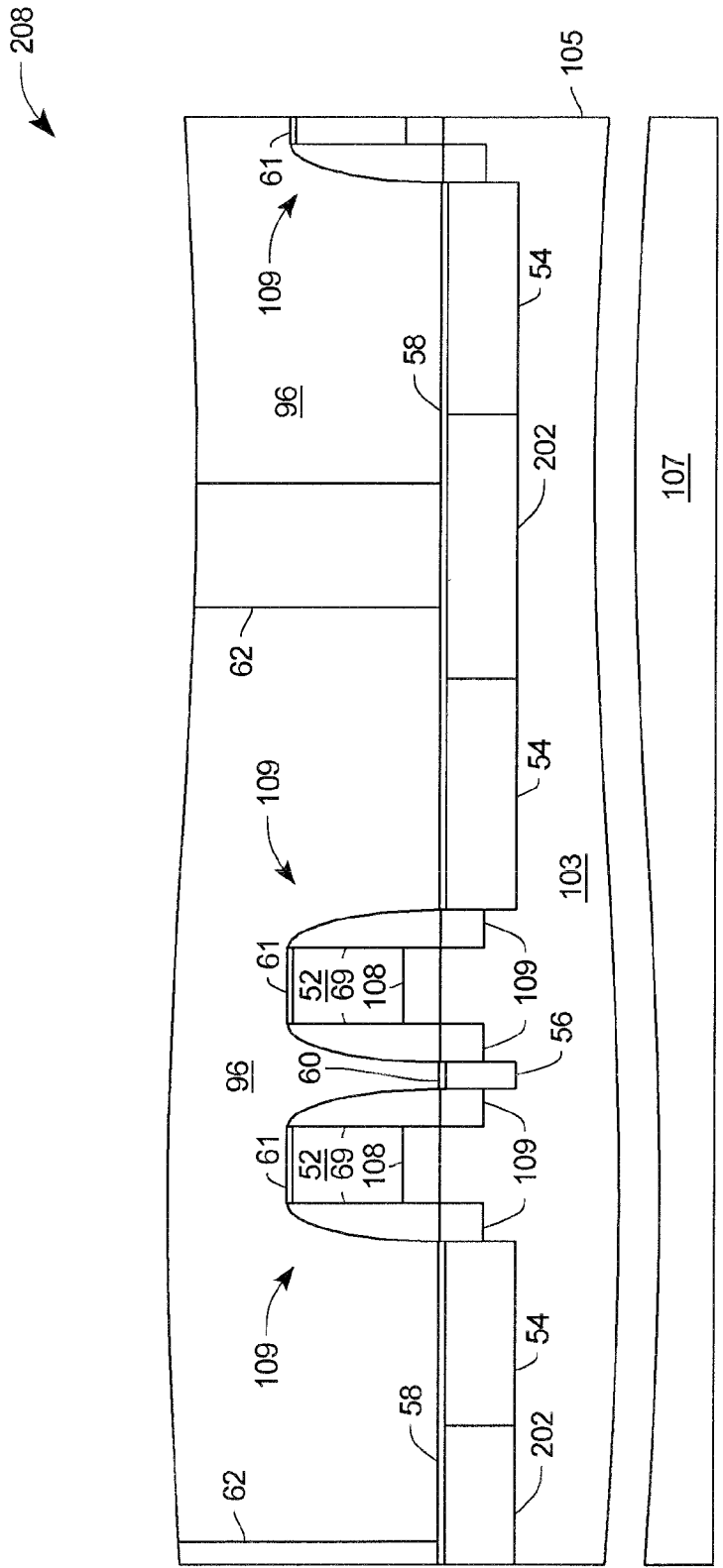

FIG. 10A is a top diagrammatic view 200 of the gate electrodes 52, source regions 54, and drain regions 56 of FIG. 4A with the addition of butted well taps 202 under the source contacts 62 in the source regions 54, and drain ballasts 204 formed by a gap between the drain silicide 60 and the silicide 206 under the drain contacts 64 in the drain regions 56. FIG. 10B is a diagrammatic side view 208 taken along line 10B-10B in FIG. 10A. Including the well taps 202 into the serpentine gate structure shown in FIG. 4, unlike including the well taps 40 in the waffle transistor 42 shown in FIG. 1, does not fragment the source regions 54 into small squares. Also, the source silicides 58 connect all parts of the source regions 54 together, and the effective size of the MOSFET power transistor 98 is not reduced by the addition of the well taps 202. Moreover, all of the source regions 54 are directly connected to a well tap 202, providing less susceptibility to latchup than the waffle transistor 42 of FIG. 2.

Figure 10C:
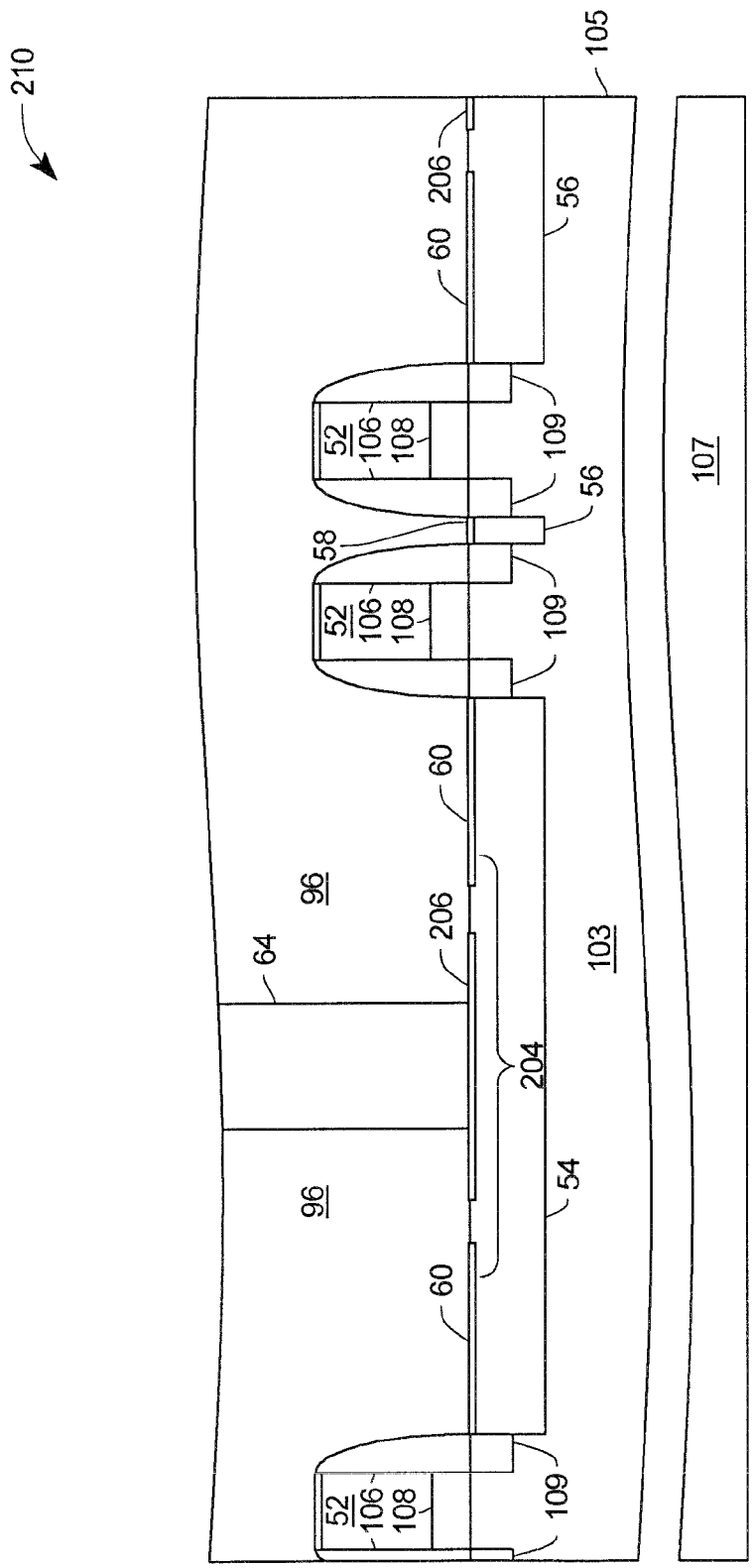

FIG. 10C is a side diagrammatic view 210 taken along line 10C-10C in FIG. 10A showing a cross section of one of the drain ballasts 204. Those skilled in the art will understand that depending on the size of the power MOSFET 200 and the design rules for fabricating the transistor, the drain regions 60 may have to be increased vertically in FIG. 10A to accommodate the ballasts 204. However, since the source 58 and drain 60 are not linked, the source 58 does not have to change. Even with the slightly increased drain regions 60, the increase in the size of the transistor 200 is small compared to the increase in the size of the waffle transistor shown in FIG. 3, because the size increases are only manifest on the drain side of the device. In contrast, ballasting increased the dimensions of both source and drain for the waffle.

Figure 11:
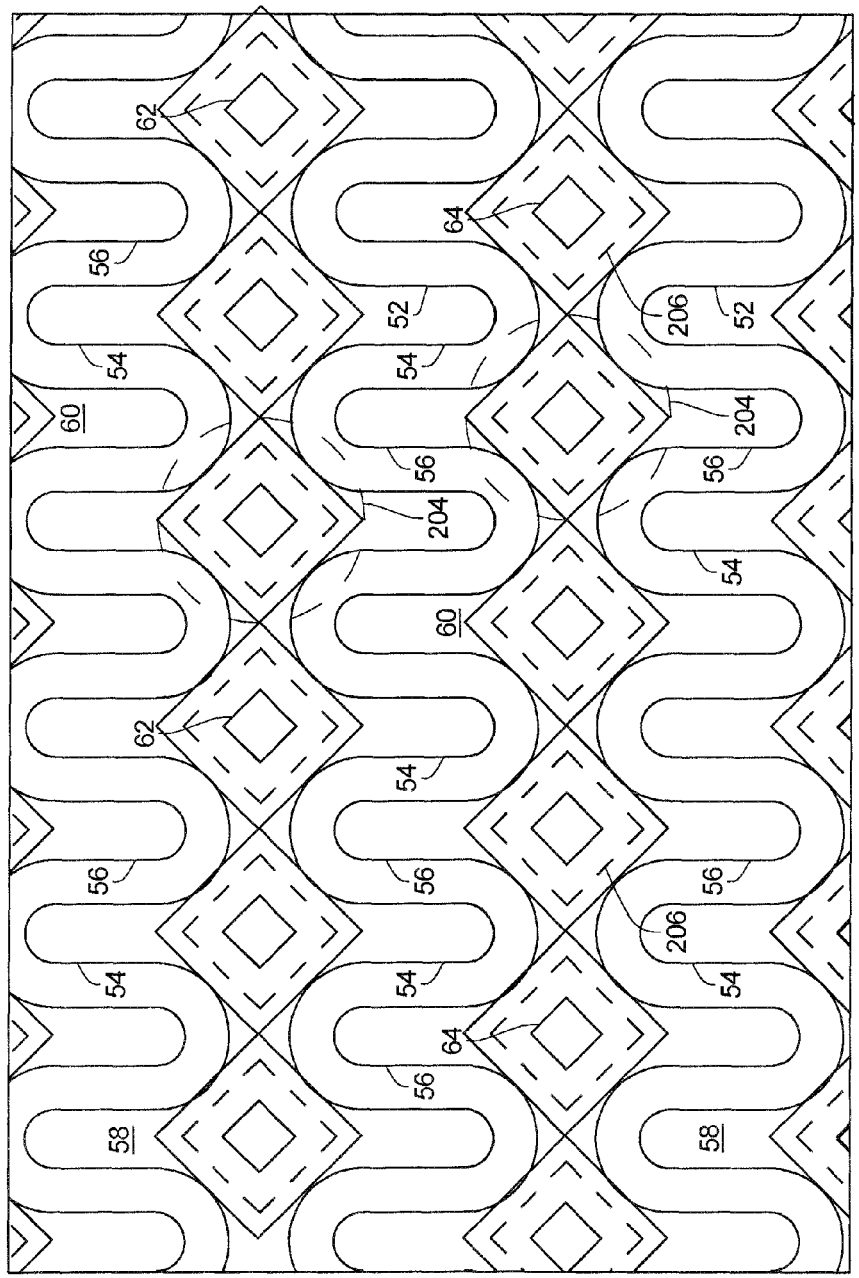
FIG. 11 is a top diagrammatic view of FIG. 4A with the addition of ballast resistors around both the source contacts and the drain contacts.

FIG. 11 is a top diagrammatic view 220 of the gates 52, source regions 54, and drain regions 56 of FIG. 4A with the addition of ballast resistors 204 around both the source contacts 62 and the drain contacts 64 for power transistors 220 which may have their source regions and drain regions reversed during operation of the transistor 220 which may occur in some applications. Thus, the drain regions will have ballast resistors 204 if the transistor operation is reversed.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A power MOSFET comprising:
   a) first and second source regions and a drain region adjacent to a top surface of a layer formed on a top surface of a substrate; and
   b) a first gate between said first source region and said drain region and a second gate between said drain region and said second source region, said first and second gates having a first plurality of sections each consisting of a curved section and a straight section;
   c) wherein said straight sections in said first plurality of sections in each of said first and second gates are parallel to each other, the curved sections alternately face in opposite directions to provide a serpentine pattern of alternating convex and concave curved sections and said first and second gates are substantially a mirror image of each other with respect to a plane between said first and second gates which is orthogonal to said top surface of said substrate.

2. The power MOSFET of claim 1 wherein each of said curved sections are substantially half circles.

3. The power MOSFET of claim 1 further including a contact to said drain located substantially in the middle of a rectangle formed by the centers of adjacent curved sections of said first gate and the centers of adjacent curved sections of said second gate wherein said adjacent curved sections of said first gate and said adjacent curved sections of said second gate are substantially mirror images with respect to said plane.

4. The power MOSFET of claim 1 further including first and second metal layers with said second metal layer above said first metal layer, each of said first and second metal layers having a second plurality of parallel segments wherein each of said parallel segments of said first metal layer has a corresponding parallel segment of said second metal layer which is substantially congruent with said corresponding parallel segment of said first metal layer, said parallel corresponding segments overlaying each other for a substantial length of said first and second metal layers.

5. The power MOSFET of claim 4 wherein a contact electrically couples said drain to one of said second plurality of parallel segments of said first metal layer.

6. The power MOSFET of claim 4 wherein one of said second plurality of parallel segments of each of said first and second metal layers has a center longitudinal axis lying substantially in said plane.

7. The power MOSFET of claim 4 further including a third plurality of vias between each of said segments on said first metal layer and said corresponding segments of said second metal layer, said vias spaced apart from said plane.

8. The power MOSFET set forth in claim 1 further including a well tap beneath a silicide layer in contact with said first source region.

9. The MOSFET set forth in claim 1 further including a ballast resistor in said drain region.

10. The power MOSFET set forth in claim 9 wherein said ballast resistor comprises a gap in a silicide layer under said contact and a silicide layer over a remaining portion of said drain region.

11. The power MOSFET set forth in claim 1 further including a ballast resistor in said first source region.

12. A power MOSFET comprising:
a) first and second source regions and a drain region adjacent to a top surface of a layer formed on a top surface of a substrate;
b) a first gate between said first source region and said drain region and a second gate between said drain region and said second source region, said first and second gates having a first plurality of sections each consisting of a half circle curved section and a straight section wherein said straight sections in each of said first and second gates are parallel to each other, and said first and second gates are substantially a mirror image of each other with respect to a plane between said first and second gates which is orthogonal to said top surface of said substrate;
c) first and second metal layers with said second metal layer above said first metal layer, each of said first and second metal layers having a second plurality of parallel segments wherein each of said parallel segments of said first metal layer has a corresponding parallel segment of said second metal layer which is substantially congruent with said corresponding parallel segment of said first metal layer, said parallel corresponding segments overlaying each other for a substantial length of said first and second metal layers; and
d) a contact electrically coupling said drain to one of said second plurality of parallel segments of said first metal layer.

13. The power MOSFET of claim 12 further including a contact to said drain located substantially in the middle of a rectangle formed by the centers of adjacent curved sections of said first gate and the centers of adjacent curved sections of said second gate wherein said adjacent curved sections of said first gate and said adjacent curved sections of said second gate are substantially mirror images with respect to said plane.

14. The power MOSFET of claim 12 wherein one of said second plurality of parallel segments of each of said first and second metal layers has a center longitudinal axis lying substantially in said plane.

15. The power MOSFET of claim 12 further including a third plurality of vias between each of said segments on said first metal layer and said corresponding segments of said second metal layer, said vias spaced apart from said plane.

16. The power MOSFET set forth in claim 12 further including a well tap beneath a silicide layer in contact with said first source region.

17. The power MOSFET set forth in claim 12 further including a ballast resistor in said drain region.

18. The power MOSFET set forth in claim 17 wherein said ballast resistor comprises a gap in a silicide layer under said contact and a silicide layer over a remaining portion of said drain region.

19. The power MOSFET set forth in claim 12 further including a ballast resistor in said first source region.

20. A method for forming a power MOSFET comprising the steps of:
a) forming first and second source regions and a drain region adjacent to a top surface of a layer formed on a top surface of a substrate; and
b) forming a first gate between said first source region and said drain region and a second gate between said drain region and said second source region, said first and second gates having a first plurality of sections each consisting of a curved section and a straight section;
c) wherein said straight sections in said first plurality of sections in each of said first and second gates are parallel to each other, the curved sections alternately face in opposite directions to provide a serpentine pattern of alternating convex and concave curved sections, and said first and second gates are substantially a mirror image of each other with respect to a plane between said first and second gates which is orthogonal to said top surface of said substrate.

21. The method of claim 20 wherein each of said curved sections are substantially half circles.

22. The method of claim 20 further including forming a contact to said drain located substantially in the middle of a rectangle formed by the centers of adjacent curved sections of said first gate and the centers of adjacent curved sections of said second gate wherein said adjacent curved sections of said first gate and said adjacent curved sections of said second gate are substantially mirror images with respect to said plane.

23. The method of claim 20 further including forming first and second metal layers with said second metal layer above said first metal layer, each of said first and second metal layers having a second plurality of parallel segments wherein each of said parallel segments of said first metal layer has a corresponding parallel segment of said second metal layer which is substantially congruent with said corresponding parallel segment of said first metal layer, said parallel corresponding segments overlaying each other for a substantial length of said first and second metal layers.

24. The method of claim 23 wherein a contact electrically couples said drain to one of said second plurality of parallel segments of said first metal layer.

25. The method of claim 23 wherein one of said second plurality of parallel segments of each of said first and second metal layers has a center longitudinal axis lying substantially in said plane.

26. The method of claim 23 further including forming a third plurality of vias between each of said segments on said first metal layer and said corresponding segments of said second metal layer, said vias spaced apart from said plane.

27. The method set forth in claim 24 further including forming a well tap beneath a silicide layer in contact with said first source region.

28. The method set forth in claim 20 further including forming a ballast resistor in said drain region.

29. The method set forth in claim 28 wherein said ballast resistor comprises a gap in a silicide layer under said contact and a silicide layer over a remaining portion of said drain region.

30. The method set forth in claim 20 further including forming a ballast resistor in said first source region.

* * * * *